US012620780B2

(12) United States Patent
Hashimoto et al.

(10) Patent No.: US 12,620,780 B2
(45) Date of Patent: May 5, 2026

(54) SURFACE-EMITTING QUANTUM CASCADE LASER

(71) Applicant: KABUSHIKI KAISHA TOSHIBA, Tokyo (JP)

(72) Inventors: Rei Hashimoto, Edogawa (JP); Tsutomu Kakuno, Fujisawa (JP); Kei Kaneko, Yokohama (JP); Shinji Saito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 27 days.

(21) Appl. No.: 17/302,237

(22) Filed: Apr. 28, 2021

(65) Prior Publication Data

US 2021/0399526 A1 Dec. 23, 2021

(30) Foreign Application Priority Data

Jun. 19, 2020 (JP) ................................. 2020-106268

(51) Int. Cl.
*H01S 5/34* (2006.01)
*H01S 5/11* (2021.01)
*H01S 5/12* (2021.01)
*H01S 5/18* (2021.01)

(52) U.S. Cl.
CPC .............. *H01S 5/3401* (2013.01); *H01S 5/11* (2021.01); *H01S 5/1237* (2013.01); *H01S 5/18* (2013.01)

(58) Field of Classification Search
CPC ........ H01S 5/3401; H01S 5/11; H01S 5/3402; H01S 5/0287
See application file for complete search history.

(56) References Cited

U.S. PATENT DOCUMENTS

| | | | |
|---|---|---|---|
| 2002/0114369 A1 | 8/2002 | Kinoshita | |
| 2002/0176475 A1 | 11/2002 | Sai et al. | |
| 2008/0240193 A1* | 10/2008 | Noda ..................... | B82Y 20/00 |
| | | | 372/49.01 |
| 2013/0016749 A1 | 1/2013 | Motoda | |
| 2017/0063044 A1* | 3/2017 | Dougakiuchi ........ | H01S 5/1221 |
| 2018/0166858 A1* | 6/2018 | Hashimoto ......... | H01S 5/04254 |
| 2019/0074663 A1* | 3/2019 | Saito ......................... | H01S 5/11 |

(Continued)

FOREIGN PATENT DOCUMENTS

| | | |
|---|---|---|
| CN | 109861078 A | 6/2019 |
| JP | 2002-223033 A | 8/2002 |

(Continued)

OTHER PUBLICATIONS

English Translation of Matsubara (Year: 2008).*

(Continued)

*Primary Examiner* — Minsun O Harvey
*Assistant Examiner* — Stephen Sutton Kotter
(74) *Attorney, Agent, or Firm* — Oblon, McClelland, Maier & Neustadt, L.L.P.

(57) ABSTRACT

According to one embodiment, a surface-emitting quantum cascade laser includes a substrate; a mesa portion of a semiconductor stacked body located on the substrate, and a reflective film located at a sidewall of the mesa portion. The mesa portion includes a light-emitting layer emitting light due to an intersubband transition of a carrier, and a photonic crystal layer including a two-dimensional diffraction grating.

14 Claims, 5 Drawing Sheets

(56)       References Cited

U.S. PATENT DOCUMENTS

| | | | |
|---|---|---|---|
| 2019/0199064 A1* | 6/2019 | Hashimoto | H01S 5/124 |
| 2020/0185885 A1* | 6/2020 | Liu | H01S 5/1237 |
| 2021/0351570 A1* | 11/2021 | Fujita | H01S 5/0425 |

FOREIGN PATENT DOCUMENTS

| | | | | |
|---|---|---|---|---|
| JP | 2002-353563 A | | 12/2002 | |
| JP | 2003008148 A | * | 1/2003 | B82Y 20/00 |
| JP | 3612101 B2 | | 1/2005 | |
| JP | 2008135441 A | * | 6/2008 | |
| JP | 2008-243963 A | | 10/2008 | |
| JP | 2008-306165 A | | 12/2008 | |
| JP | 2009-231773 A | | 10/2009 | |
| JP | 2012-129497 A | | 7/2012 | |
| JP | 2013-021205 A | | 1/2013 | |
| JP | 2018-093022 A | | 6/2018 | |
| JP | 2019-047023 A | | 3/2019 | |

OTHER PUBLICATIONS

Liang et al., "Room temperature surface emission on large-area photonic crystal quantum cascade lasers", Applied Physics Letters, 114, 031102, Jan. 23, 2019, 6 pages.
Japanese Notice of Reasons for Refusal issued May 23, 2025 in Japanese Patent Application No. 2024-135443 with English Machine translation, 8 pgs.

* cited by examiner

SURFACE-EMITTING QUANTUM CASCADE LASER

CROSS-REFERENCE TO RELATED APPLICATION

This application is based upon and claims the benefit of priority from Japanese Patent Application No. 2020-106268, filed on Jun. 19, 2020; the entire contents of which are incorporated herein by reference.

FIELD

Embodiments described herein relate generally to a surface-emitting quantum cascade laser.

BACKGROUND

A quantum cascade laser has been proposed in which surface emission made possible by utilizing a photonic crystal layer that includes a two-dimensional diffraction grating. The oscillation threshold current of such a surface-emitting quantum cascade laser undesirably increases when the oscillation wavelength that is controlled by the photonic crystal layer shifts from the peak wavelength of the gain curve of the light-emitting layer due to manufacturing fluctuation or the like.

DETAILED DESCRIPTION

Figure 1:
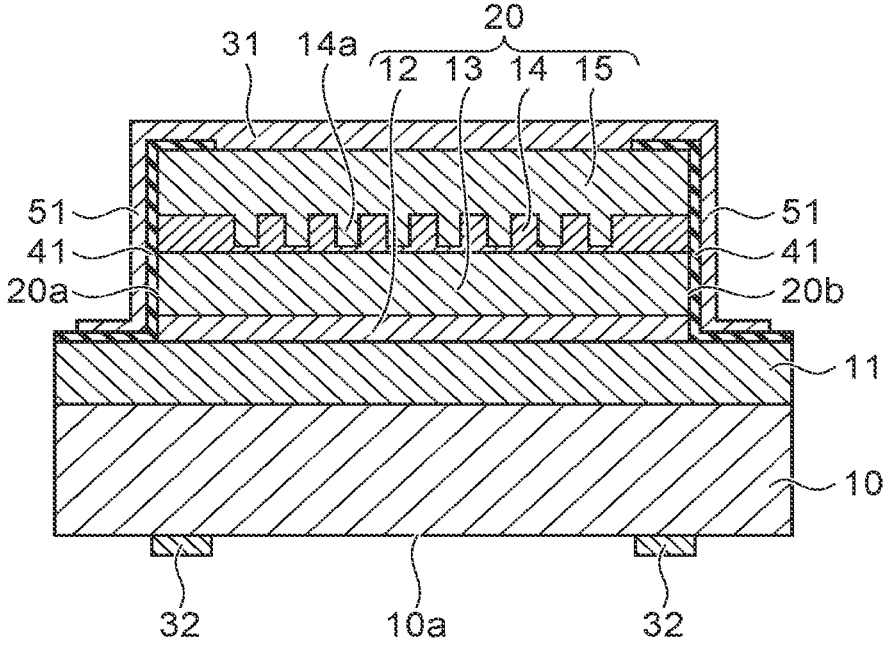
FIG. 1 is a schematic cross-sectional view of a surface-emitting quantum cascade laser according to an embodiment.

According to one embodiment, a surface-emitting quantum cascade laser includes a substrate; a mesa portion of a semiconductor stacked body located on the substrate, and a reflective film located at a sidewall of the mesa portion. The mesa portion includes a light-emitting layer emitting light due to an intersubband transition of a carrier, and a photonic crystal layer including a two-dimensional diffraction grating.

Embodiments will now be described with reference to the drawings. The same components in the drawings are marked with the same reference numerals.

FIG. 1 is a schematic cross-sectional view of a surface-emitting quantum cascade laser according to the embodiment.

The surface-emitting quantum cascade laser according to the embodiment includes a substrate 10, a mesa portion 20 of a semiconductor stacked body, a first electrode 31, a second electrode 32, and a reflective film 51.

A first cladding layer 11 is located on the substrate 10; and the mesa portion 20 is located on the first cladding layer 11. The mesa portion 20 protrudes in a columnar shape on the first cladding layer 11 and includes a confinement structure for a current supplied to a light-emitting layer 13 via the first electrode 31 and the second electrode 32.

Figure 2A:
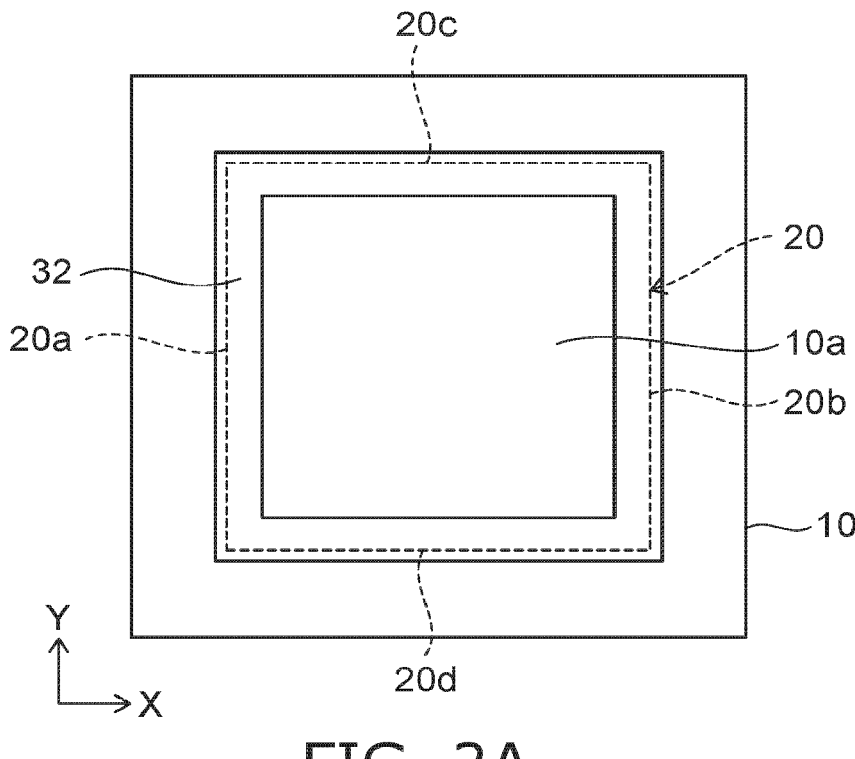
FIGS. 2A and 2B are schematic plan views of the surface-emitting quantum cascade laser according to the embodiment.

FIG. 2A is a schematic plan view of the surface-emitting quantum cascade laser according to the embodiment when viewed from the light-emitting surface side (the lower surface side of FIG. 1). An X-direction and a Y-direction are two directions that are orthogonal to each other in a plane parallel to a light-emitting surface 10a.

The mesa portion 20 has a rectangular prism shape that includes four sidewalls 20a, 20b, 20c, and 20d. In the example shown in FIG. 2A, the upper surface or lower surface of the mesa portion 20 is square.

As shown in FIG. 1, the mesa portion 20 includes a first guide layer 12 located on the first cladding layer 11, the light-emitting layer 13 located on the first guide layer 12, a photonic crystal layer 14 located on the light-emitting layer 13, and a second cladding layer 15 located on the photonic crystal layer 14.

The light-emitting layer 13 includes a quantum well structure that generates intersubband transitions of carriers. For example, the light-emitting layer 13 includes an n-type Group III-V compound semiconductor layer doped with silicon and emits light due to intersubband transitions of electrons.

The refractive index of the first cladding layer 11 and the refractive index of the second cladding layer 15 are less than the refractive index of the first guide layer 12, the refractive index of the light-emitting layer 13, and the refractive index of the photonic crystal layer 14.

The photonic crystal layer 14 includes a two-dimensional diffraction grating. The light that is emitted by the light-emitting layer 13 resonates in directions along the front surface of the light-emitting layer 13; and modes are selected by the two-dimensional diffraction grating and emitted in a substantially normal direction with respect to the front surface of the light-emitting layer 13. The substantially normal direction means a direction having an angle with respect to the front surface of the light-emitting layer 13 that is not less than 81° and not more than 99°.

Figure 3:
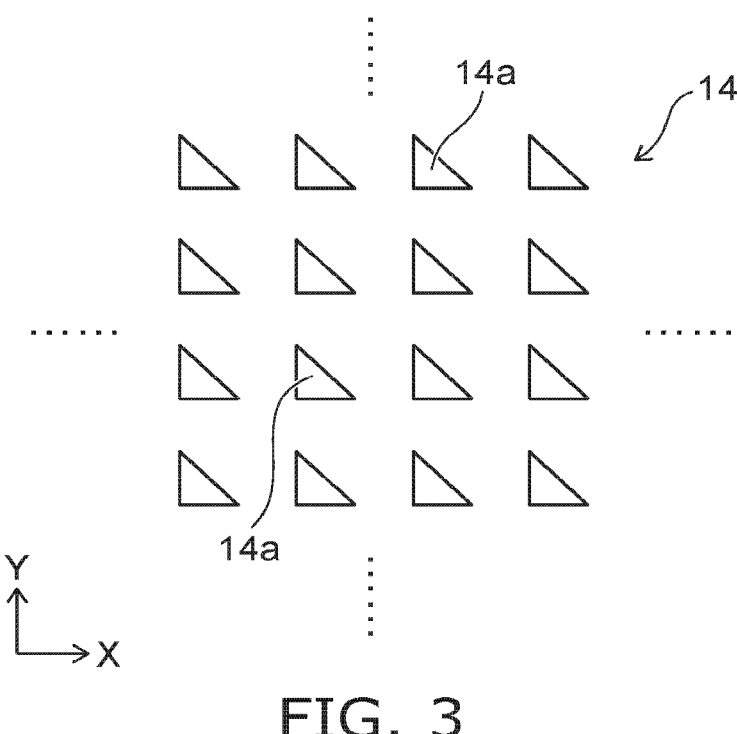
FIG. 3 is a schematic plan view of a photonic crystal layer of the surface-emitting quantum cascade laser according to the embodiment.

FIG. 3 is a schematic plan view of the photonic crystal layer 14.

The photonic crystal layer 14 includes, for example, multiple pits 14a that are periodically arranged as the two-dimensional diffraction grating. For example, the pit 14a is where a right-triangular-prism-shaped region is cut out from the photonic crystal layer 14. The shape and arrangement of the pit 14a is not limited to the shape and arrangement shown in FIG. 3.

As shown in FIG. 1, the reflective film 51 is located at the sidewalls 20a and 20b of the mesa portion 20. The reflective film 51 is located on at least the two opposite sidewalls 20a and 20b of the four sidewalls 20a, 20b, 20c, and 20d shown in FIG. 2A. In the example, the reflective film 51 is located at all of the sidewalls 20a, 20b, 20c, and 20d of the mesa portion 20.

The reflectance of the reflective film 51 for the light emitted by the light-emitting layer 13 is greater than the reflectance of interfaces between the air and the semiconductor layers included in the mesa portion 20. The reflectance of the reflective film 51 for the light emitted by the light-emitting layer 13 is not less than 40%. In the example shown in FIG. 1, the reflective film 51 is a metal film and includes, for example, gold.

The first electrode 31 is located continuously with the reflective film 51 at the front surface (the upper surface in FIG. 1) of the mesa portion 20. The first electrode 31 blankets over the front surface of the mesa portion 20 and contacts the front surface of the mesa portion 20. The first electrode 31 and the reflective film 51 are formed simultaneously of the same material. For example, the first electrode 31 and the reflective film 51 can be formed by vapor deposition or sputtering.

An insulating film 41 is located between the reflective film 51 and the sidewalls 20a, 20b, 20c, and 20d of the mesa portion 20. The insulating film 41 is, for example, a silicon oxide film. For example, a titanium film can be provided as an adhesion film between the insulating film 41 and the reflective film 51, e.g., the gold film.

A portion of the insulating film 41 is located also at the periphery of the mesa portion 20 at the front surface of the first cladding layer 11. A portion of the reflective film 51 is located also on the insulating film 41 at the periphery of the mesa portion 20.

The second electrode 32 is located at the surface of the substrate 10 on the side opposite to the surface on which the semiconductor stacked body that includes the mesa portion 20 is stacked. As shown in FIG. 2A, for example, the second electrode 32 has a rectangular frame shape. The surface of the substrate 10 at which the second electrode 32 is located includes a region that is surrounded with the second electrode 32 and functions as a light-emitting surface (a window) 10a.

Figure 4A:
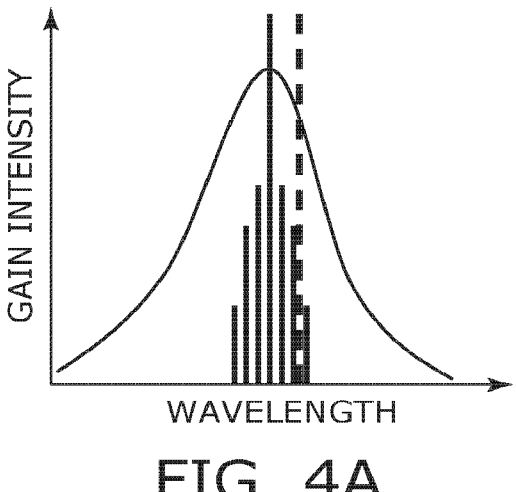
FIG. 4A shows a gain spectrum of an oscillation of the surface-emitting quantum cascade laser according to the embodiment.

FIG. 4A shows the gain spectrum of the oscillation of the surface-emitting quantum cascade laser according to the embodiment.

In FIG. 4A, the fine solid line illustrates the gain curve of the light-emitting layer 13. This curve is determined by the composition of the light-emitting layer 13 and/or the width of the quantum wells.

In FIG. 4A, the broken line illustrates the gain spectrum of the oscillation wavelength of the surface emission that is controlled (selected) by the photonic crystal layer 14. The two-dimensional diffraction grating of the photonic crystal layer 14 is designed so that the oscillation wavelength matches the peak wavelength of the gain curve of the light-emitting layer 13. However, due to manufacturing fluctuation, etc., as shown in FIG. 4A, there are cases where the oscillation wavelength that is controlled by the photonic crystal layer 14 undesirably shifts from the peak wavelength of the gain curve of the light-emitting layer 13. In other words, the oscillation is undesirably generated at a wavelength having a gain that is slightly less than the peak, which causes the oscillation threshold current to be greater than the ideal value.

Figure 4B:
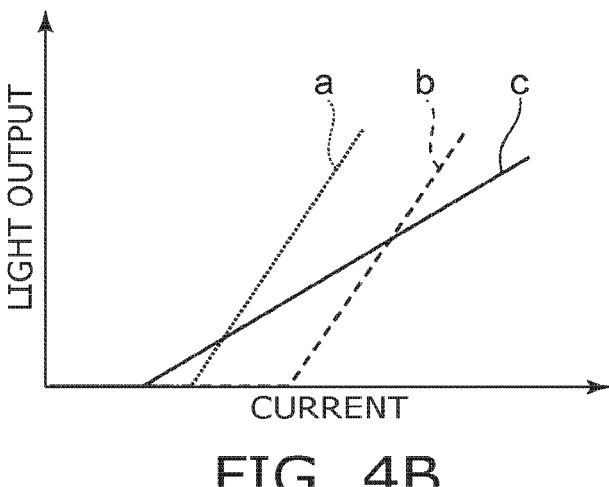
FIG. 4B shows current-output characteristics of the surface-emitting quantum cascade laser according to the embodiment.

FIG. 4B shows the current-output characteristics (IL characteristics) of the surface-emitting quantum cascade laser.

In FIG. 4B, an IL characteristic a that is illustrated by the dotted line shows the ideal IL characteristic when the oscillation wavelength that is controlled by the photonic crystal layer 14 matches the peak wavelength of the gain curve of the light-emitting layer 13. Conversely, when the oscillation wavelength that is controlled by the photonic crystal layer 14 undesirably shifts from the peak wavelength of the gain curve of the light-emitting layer 13, the oscillation threshold current becomes higher than the ideal IL characteristic as in an IL characteristic b shown by the broken line in FIG. 4B.

According to the embodiment, by providing the reflective film 51 at the sidewalls 20a, 20b, 20c, and 20d of the mesa portion 20, resonance due to a Fabry-Perot resonator inside the mesa portion 20 can be induced before the surface emission.

In FIG. 4A, the thick solid lines illustrate the gain spectrum of the oscillation wavelength due to the Fabry-Perot resonator.

The laser light that is produced when one of the longitudinal modes (the multimodes) of the oscillation due to the Fabry-Perot resonator matches the gain peak of the light-emitting layer 13 is extracted in a substantially normal direction with respect to the front surface of the light-emitting layer 13 by the two-dimensional diffraction grating of the photonic crystal layer 14. If a wavelength that is controlled by the photonic crystal layer 14 is included in the longitudinal modes (the multimodes) of the oscillation due to the Fabry-Perot resonator, the laser light has surface emission at that wavelength.

In FIG. 4B, the solid line illustrates an IL characteristic c of the surface-emitting quantum cascade laser according to the embodiment.

According to the embodiment, even when the oscillation wavelength that is controlled by the photonic crystal layer 14 undesirably shifts from the peak wavelength of the gain curve of the light-emitting layer 13, oscillations are induced by utilizing the longitudinal modes due to the Fabry-Perot resonator that utilizes the reflective film 51; and the oscillation threshold current can be reduced. The surface-emitting quantum cascade laser according to the embodiment is effective particularly in regions where the necessary light output is low.

The quantum cascade laser emits light due to intersubband transitions of carriers. In intersubband transitions, the oscillation wavelength is independent of the bandgap energy; therefore, the optical absorption is low at regions proximate to the sidewalls of the mesa portion 20 where there is no carrier injection or the injection amount is low. Therefore, the loss is low at such regions even when the reflection by the reflective film 51 causes oscillations utilizing the regions proximate to the sidewalls of the mesa portion 20.

Figure 5:
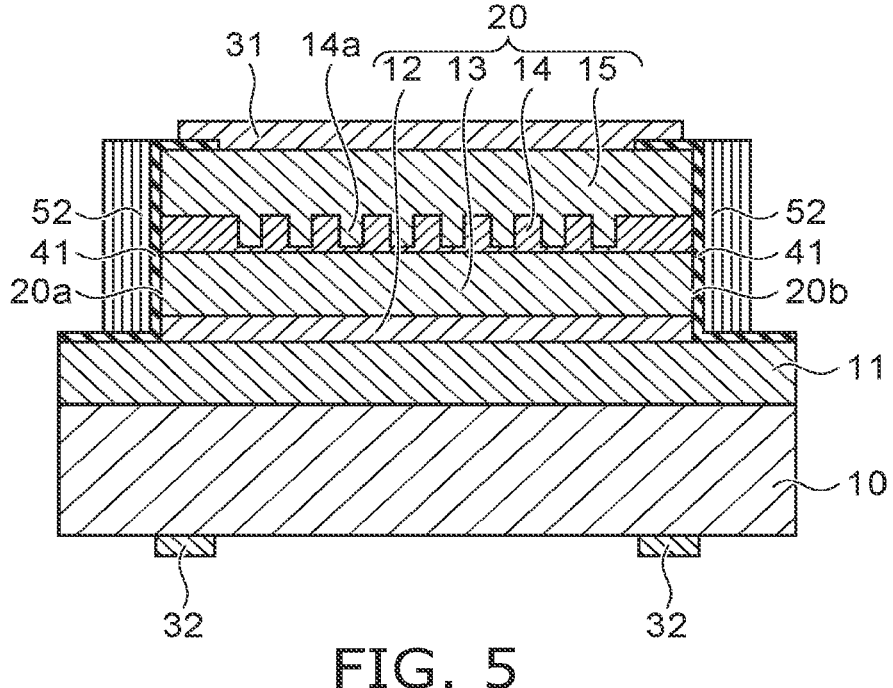
FIG. 5 is a schematic cross-sectional view showing another example of a reflective film of the surface-emitting quantum cascade laser according to the embodiment.

FIG. 5 is a schematic cross-sectional view showing another example of the reflective film of the surface-emitting quantum cascade laser according to the embodiment.

In the example shown in FIG. 5, a reflective film 52 that is located at the sidewalls 20a and 20b of the mesa portion 20 is a dielectric multilayer film. The optical film thickness of the dielectric multilayer film is designed according to the oscillation wavelength.

When the planar shape (the shape of the upper surface or the lower surface) of the mesa portion 20 is square as shown in FIG. 2A, oscillation occurs preferentially in one of the X-direction or the Y-direction. There are many cases where the direction in which the oscillation occurs, i.e., the X-direction or the Y-direction, cannot be controlled; it is favorable for the reflective films 51 and 52 to be located at all of the sidewalls 20a, 20b, 20c, and 20d of the mesa portion 20.

Figure 2B:
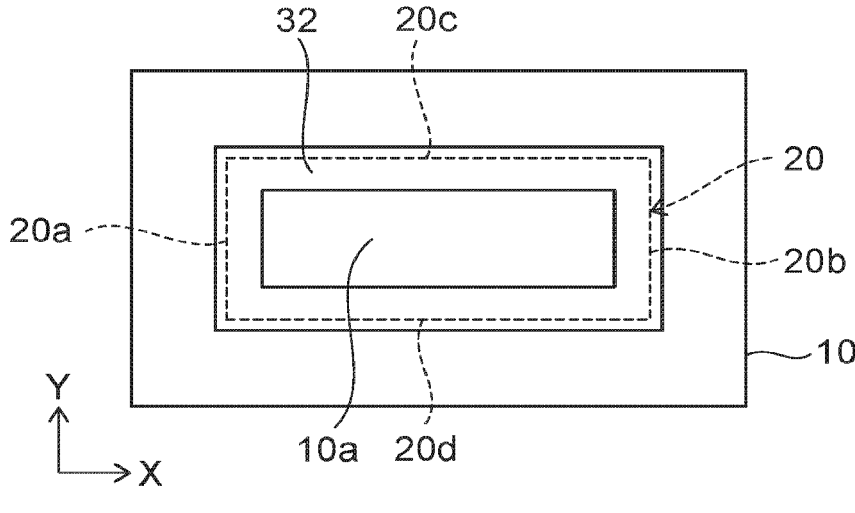

As shown in FIG. 2B, the planar shape of the mesa portion 20 may be rectangular. In such a case, the oscillation occurs easily in the longitudinal direction (the X-direction). Accordingly, there are also cases where the reflective films 51 and 52 may be provided at the sidewalls 20a and 20b and not provided at the sidewalls 20c and 20d.

For example, the surface-emitting quantum cascade laser according to the embodiment can emit single-mode laser light in the mid-infrared to terahertz region. For example, the surface-emitting quantum cascade laser according to the embodiment can be used in gas spectroscopy analysis. Also, for example, the surface-emitting quantum cascade laser according to the embodiment can be used as infrared illumination in an application that detects a gas leak with an infrared camera.

The mesa portion 20 may have a circular columnar shape. The upper surface or lower surface of the circular columnar mesa portion 20 is circular. Here, circular is not limited to a perfect circle and includes an ellipse or a circle that is distorted from a perfect circle. The reflective film 51 or the reflective film 52 described above is located at the sidewalls of the circular columnar mesa portion 20 in at least two positions having the central axis interposed. For example, it is favorable for the reflective film 51 or the reflective film 52 to be located at all of the sidewalls of the circular columnar mesa portion 20. Also, the mesa portion 20 may have a polygonal prism shape such as an octagonal prism, a hexagonal prism, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A surface-emitting quantum cascade laser, comprising:
a substrate;
a first cladding layer provided on the substrate;
a mesa portion of a semiconductor stacked body stacked in a stacking direction and located on the first cladding layer, the mesa portion including
    a light-emitting layer emitting light due to an intersubband transition of a carrier,
    a photonic crystal layer including a plurality of pits either arranged as or forming a two-dimensional diffraction grating, and
    a second cladding layer located on the photonic crystal layer and located in the plurality of pits;
a reflective film located at opposing sidewalls of the mesa portion;
a Fabry-Perot resonator located in the mesa portion; and
an insulating film,
a width direction between the opposing sidewalls being perpendicular to the stacking direction, and a width of the mesa portion in the width direction being less than a width of the first cladding layer in the width direction, wherein
the mesa portion includes a guide layer located between the first cladding layer and the light-emitting layer,
a width of the guide layer is smaller than the width of the first cladding layer in the width direction,
the width of the first cladding layer in the width direction is the same as a width of the substrate in the width direction,
the first cladding layer protrudes in both directions in the width direction with respect to the mesa portion,

wherein the light-emitting layer, photonic crystal layer, second cladding layer and guide layer each have the same width in the width direction,
the insulating film is located between the reflective film and the sidewall of the mesa portion,
the first cladding layer has an uppermost planar surface extending under the mesa, the insulating film and the reflective film, and
the guide layer and the insulating film are formed directly on the uppermost surface of the first cladding layer.

2. The laser according to claim 1, wherein
the mesa portion has a rectangular prism shape including four sidewalls, and
the reflective film is located on at least two opposite sidewalls of the four sidewalls.

3. The laser according to claim 1, wherein
the mesa portion has a circular columnar shape.

4. The laser according to claim 1, wherein
a reflectance of the reflective film for light emitted by the light-emitting layer is not less than 40%.

5. The laser according to claim 1, wherein
the reflective film is a metal film.

6. The laser according to claim 5, wherein
the metal film includes gold.

7. The laser according to claim 5, further comprising:
a first electrode connected with the reflective film at the mesa portion; and
an insulating film located between the reflective film and the sidewall of the mesa portion.

8. The laser according to claim 1, wherein
the reflective film is a dielectric multilayer film.

9. The laser according to claim 1, further comprising:
a first electrode connected with the reflective film at the mesa portion; and
a second electrode located at a back surface of the substrate.

10. The laser according to claim 9, wherein
the second electrode has a frame shape.

11. The laser according to claim 1, wherein
the light-emitting layer includes an n-type Group III-V compound semiconductor doped with silicon.

12. The laser according to claim 1, wherein
the first cladding layer does not extend into the mesa portion.

13. The laser according to claim 7, wherein
a lowermost surface of the insulating film and a lowermost surface of the guide layer are coplanar.

14. A surface-emitting quantum cascade laser, comprising:
a substrate;
a first cladding layer provided on the substrate;
a mesa portion of a semiconductor stacked body stacked in a stacking direction and located on the first cladding layer, the mesa portion including
    a light-emitting layer emitting light due to an intersubband transition of a carrier,
    a photonic crystal layer including a plurality of pits either arranged as or forming a two-dimensional diffraction grating, and
    a second cladding layer located on the photonic crystal layer and located in the plurality of pits;
a reflective film located at opposing sidewalls of the mesa portion;
a Fabry-Perot resonator located in the mesa portion;
a first electrode; and
an insulating film, a width direction between the opposing sidewalls being perpendicular to the stacking direction, and a width of the mesa portion in the width direction being less than a width of the first cladding layer in the width direction, wherein the mesa portion includes a guide layer located between the first cladding layer and the light-emitting layer, a width of the guide layer is smaller than the width of the first cladding layer in the width direction, the width of the first cladding layer in the width direction is the same as a width of the substrate in the width direction, the reflective film is a metal film, the first electrode is connected with the reflective film at the mesa portion, the insulating film is located between the reflective film and the sidewall of the mesa portion, and a lowermost surface of the insulating film and a lowermost surface of the guide layer are coplanar.

* * * * *